United States Patent
Sambasivan et al.

(10) Patent No.: US 7,311,944 B2
(45) Date of Patent: Dec. 25, 2007

(54) ALUMINUM PHOSPHATE COATINGS

(75) Inventors: Sankar Sambasivan, Chicago, IL (US); Kimberly A. Steiner, Chicago, IL (US); Krishnaswamy K. Rangan, Evanston, IL (US)

(73) Assignee: Applied Thin Films, Inc., Evanston, IL (US)

( * ) Notice: Subject to any disclaimer, the term of this patent is extended or adjusted under 35 U.S.C. 154(b) by 0 days.

(21) Appl. No.: 10/745,955

(22) Filed: Dec. 23, 2003

(65) Prior Publication Data

US 2004/0206267 A1 Oct. 21, 2004

Related U.S. Application Data

(60) Provisional application No. 60/436,063, filed on Dec. 23, 2002, provisional application No. 60/436,066, filed on Dec. 23, 2002.

(51) Int. Cl.
*B05D 3/00* (2006.01)
*B05D 3/12* (2006.01)
*B05D 1/38* (2006.01)
*B05D 5/12* (2006.01)

(52) U.S. Cl. ............... 427/328; 427/299; 427/402; 427/126.1; 106/14.12; 106/287.17

(58) Field of Classification Search ............ 427/62, 427/118, 120, 12.1, 126.2, 376.6, 372, 404, 427/419.1, 419.2; 428/701, 699, 700; 106/14.12, 106/14.05, 14.44, 287.17
See application file for complete search history.

(56) References Cited

U.S. PATENT DOCUMENTS

| 2,165,619 A | 7/1939 | Albers-Schonberg |
| 3,323,889 A | 6/1967 | Carl et al. |
| 3,450,574 A | 6/1969 | Reed |
| 3,516,811 A | 6/1970 | Gatchet et al. |
| 3,694,299 A | 9/1972 | Wagner |
| 3,711,322 A | 1/1973 | Kushihashi et al. |
| 3,793,105 A | 2/1974 | Birchall et al. |
| 3,847,583 A | 11/1974 | Dislich et al. |
| 3,870,737 A | 3/1975 | Birchall et al. |
| 3,926,103 A | 12/1975 | Smith |
| 3,943,231 A | 3/1976 | Wasel-Nielsen |
| 3,960,592 A | 6/1976 | Birchall et al. |

(Continued)

FOREIGN PATENT DOCUMENTS

DE  2406411 A * 8/1974

(Continued)

OTHER PUBLICATIONS

Daviéro, S., Avinens, C., Ibanez, A., Giuntini, J.C., and Philippot, E., "Couches Minces Diélectriques de Phosphate d'Aluminum", J. Phys. III, Sep. 25, 1992, pp. 745-756. (English Abstract included).

(Continued)

*Primary Examiner*—Timothy Meeks
*Assistant Examiner*—David Turocy
(74) *Attorney, Agent, or Firm*—Reinhart Boerner Van Deuren s.c.

(57) ABSTRACT

Aluminophosphate compounds and compositions as can be used for substrate or composite films and coating to provide or enhance, without limitation, planarization, anti-biofouling and/or anti-microbial properties.

9 Claims, 5 Drawing Sheets

U.S. PATENT DOCUMENTS

| | | | |
|---|---|---|---|
| 3,984,591 A | 10/1976 | Plumat et al. | |
| 4,005,172 A | 1/1977 | Birchall et al. | |
| 4,005,232 A | 1/1977 | Colebourne et al. | |
| 4,008,299 A | 2/1977 | Birchall et al. | |
| 4,289,863 A | 9/1981 | Hill et al. | |
| 4,551,652 A | 11/1985 | Compen et al. | |
| 5,030,431 A | 7/1991 | Glemza | |
| 5,146,743 A | 9/1992 | Maus et al. | |
| 5,208,069 A | 5/1993 | Clark et al. | |
| 5,223,336 A | 6/1993 | Griffith et al. | |
| 5,292,701 A | 3/1994 | Glemza et al. | |
| 5,348,694 A | 9/1994 | Goldberger | |
| 5,411,711 A | 5/1995 | Swars | |
| 5,496,529 A | 3/1996 | Fogel et al. | |
| 5,552,361 A | 9/1996 | Rieser et al. | |
| 5,665,463 A | 9/1997 | Morgan et al. | |
| 5,698,758 A | 12/1997 | Rieser et al. | |
| 5,707,442 A | 1/1998 | Fogel et al. | |
| 5,744,777 A | 4/1998 | Bernecki et al. | |
| 5,856,027 A | 1/1999 | Murphy | |
| 5,948,516 A * | 9/1999 | Kriven et al. | 428/216 |
| 6,022,513 A | 2/2000 | Pecoraro et al. | |
| 6,036,762 A * | 3/2000 | Sambasivan | 106/287.18 |
| 6,140,410 A | 10/2000 | Kolouch | |
| 6,162,498 A | 12/2000 | Mennig et al. | |
| 6,221,955 B1 | 4/2001 | Mequanint et al. | |
| 6,312,819 B1 | 11/2001 | Jia et al. | |
| 6,379,746 B1 | 4/2002 | Birch et al. | |
| 6,383,989 B2 | 5/2002 | Jia et al. | |
| 6,403,164 B1 | 6/2002 | Jonschker et al. | |
| 6,461,415 B1 * | 10/2002 | Sambasivan et al. | 106/14.21 |
| 6,589,661 B2 | 7/2003 | Neely, Jr. et al. | |
| 2002/0054884 A1 | 5/2002 | Peetermans et al. | |
| 2004/0011245 A1 | 1/2004 | Sambasivan et al. | |
| 2005/0019615 A1 * | 1/2005 | Groves et al. | 428/701 |

FOREIGN PATENT DOCUMENTS

| | | |
|---|---|---|
| EP | 000302465 | 2/1989 |
| EP | 0539342 | 4/1993 |
| FR | 2156800 | 1/1973 |
| FR | 2176469 | 2/1973 |
| GB | 1192304 | 5/1970 |
| GB | 1322722 | 7/1973 |
| GB | 1322724 | 7/1973 |
| GB | 1322726 | 7/1973 |
| GB | 1396795 | 6/1975 |
| GB | 1451145 | 9/1976 |
| GB | 2021544 | 12/1979 |
| JP | 53011200 | 2/1978 |
| JP | 401036774 | 2/1989 |
| JP | 02142881 | 5/1990 |
| JP | 5229911 | 7/1993 |
| RU | 2148017 | 4/2000 |
| WO | WO 9821797 | 5/1998 |
| WO | WO 200142881 | 6/2001 |
| WO | WO 0216263 | 2/2002 |

OTHER PUBLICATIONS

Rothon, Roger N., "Novel, Low Curing Temperature, Glassy, Inorganic Coatings, Derived from Soluble Complexes of Aluminum and Other Metal Phosphates", Chemistry and Industry, Jun. 1, 1974, pp. 457-459.

Daviéro, S., Avinens, C., Ibanez, A., Giuntini, J.C., and Philippot, E., "Dielectric Properties of Amorphous Aluminum Phosphate Thin Films", Journal of Non-Crystalline Solids 146, 1992, pp. 279-284.

Daviéro, S., Avinens, C., Ibanez, A., Giuntini, J.C., and Philippot, E . . . "A Structural Study of Amorphous Aluminum Phosphate Thin Films by X-Ray Absorption Spectroscopy", Thin Solid Films, 226, 1993, 207-214.

Weber, Ch., Field, R., and Höfer, H.H., "Characterization of Aluminum Phosphate Gel", Key Engineering Materials, vol. 150, 1998, pp. 199-208.

* cited by examiner

ALUMINUM PHOSPHATE COATINGS

This application claims priority benefit from provisional application Ser. Nos. 60/436,063 and 60/436,066, each filed on Dec. 23, 2002 and incorporated herein by reference in its entirety; U.S. application Ser. No. 10/627,194 filed Jul. 23, 2003 from prior provisional application Ser. No. 60/398,265 filed Jul. 24, 2002; U.S. application Ser. No. 10/642,069 filed Aug. 14, 2003 from prior provisional application Ser. No. 60/403,470 filed Aug. 14, 2002; U.S. application Ser. No. 10/362,869 filed Feb. 21, 2003 from prior PCT application No. PCT/US01/41790 filed Aug. 20, 2001; and U.S. application Ser. No. 10/266,832 filed Oct. 8, 2002 as a continuation of application Ser. No. 09/644,495 filed Aug. 23, 2000 and issued as U.S. Pat. No. 6,461,415 on Oct. 8, 2002—each of which is incorporated herein by reference in its entirety.

The United States government has certain rights to this invention pursuant to Grant Nos. F49620-00-C-0022 and F49620-01-C-0014 from AFOSR (Air Force Office of Scientific Research) and DE-FG02-01ER83149, from the Department of Energy each to Applied Thin Films, Inc.

FIELD OF THE INVENTION

The present invention relates to modification of metal and alloy, ceramic, and glass surfaces with an inorganic coating to provide planarization, oxidation and corrosion protection of the coated surfaces. This invention is also related to the coating on solid supports (e.g., glass) providing one or more reactive sites for the attachment of organic or inorganic molecules including but not limited to aliphatic acids, organosilanes and biomolecules such as oligonucleotides. Stable molecular attachment can provide several desired mechanical, optical (second harmonic generation, fluorescence and like), hydrophobic, hydrophilic, tribological, biological (antimicrobial) and other properties to the solid supports coated with the inventive material. This invention is also related to chemically modifying the inventive material composition to impart useful properties such as antimicrobial property.

BACKGROUND OF THE INVENTION

Advanced alloys, including nickel-based superalloys, intermetallics of titanium-aluminum, niobium-aluminum, titanium-silicon, molybdenum-silicon-boron and others are used extensively for high temperature applications due to their desirable mechanical properties. However, their environmental durability in oxidizing or harsh environments is limited and various surface modification techniques, including protective coatings are employed to extend their lifetimes and/or use temperatures. Due to presence of surface pits, scratches, pores, or other abnormal surface features (more commonly known as pitting or crevice corrosion), accelerated oxidation or corrosion is initiated in these areas which eventually degrades the entire surface. If the surfaces are prepared adequately, advanced alloys, that contain aluminum for example, will form a uniform protective alumina scale which limits further oxidation. However, if the thermally grown scale is not uniform or contain other oxides, besides that of aluminum, the protection is compromised and the alloys are subject to rapid degradation at elevated temperatures. In addition, surface grain boundary junctions are compositionally different compared to the bulk composition which may also cause the oxide scale in those regions to be different and perhaps less protective. Therefore, there is a need for a suitable surface modification method that will allow for the slow and steady formation of predominantly alumina-rich (more preferably pure alumina scale) scale for aluminum-containing alloys.

Similar arguments are valid for chromium-based steels and other chromium-based alloys which are used in applications for boilers, heat exchangers, recuperators, interconnect for solid oxide fuel cells, automotive catalytic converters, and others as apparent to those skilled in the art. In these applications, it is desired to form a protective chromia scale which requires a minimum level of chromium content in the alloy. Higher chromium content makes the alloy more expensive and also results in compromise of other important mechanical, thermal, and electrical properties of alloys. Thus, there is a need for a protective coating for chromium-based alloys and steels which will allow for the formation of a dense and uniform protective scale of chromium oxide, especially if it can be implemented for low chromium-containing alloys.

Metal or alloy honeycomb structures are used in many applications such as catalytic converters, radiators and heat exchangers, and exterior bodies of space vehicles for thermal protection. U.S. Pat. Nos. 5,411,711 and 5,146,743, among others, discuss the metal foil catalytic converters for automotive systems. Currently, most catalytic converters used in automotive exhaust systems in the U.S. use a ceramic honeycomb substrate loaded with a precious metal catalyst. The ceramic honeycomb is used because it can tolerate the hot exhaust environment without degradation. Alloy foil honeycombs offer advantages over ceramic honeycombs in weight and electrical conductivity. Most auto pollution occurs when the engine is cold, generally after the engine is started. At low temperatures the catalysts are not effective at reducing nitrogen and oxidizing residual hydrocarbons. To alleviate this problem and achieve overall reduced emissions, alloy foil catalytic converters can be resistively heated to ensure that the catalysts are kept at a temperature that allows them to function optimally. However, these thin foils are prone to oxidation and corrosion in the exhaust stream. Foils are particularly sensitive to oxidation because the original alloy is so thin, that the buildup of a thick oxide scale results in dimensional changes and changes in mechanical properties. For this reason, expensive oxidation resistant alloys are required. A thin oxidation resistant coating that will not substantially increase the thickness of the foil will be useful to reduce oxidation and corrosion, allowing the use of less expensive alloys, while still allowing the use of resistive heating to reduce emissions. Another such application is the potential use of alloy foils is for thermal protection systems for next-generation reusable launch vehicles for space travel. Present inventive material can be used as the oxidation protection coatings for these applications.

Currently, there are many ways to combat corrosion of aluminum and ferrous alloys. They include painting, electroplating, composite coverings, use of more corrosion resistant alloys, anodizing and chromating the surfaces of metal. Many of these processes are not environmentally friendly, cannot be maintained or repaired in the field, are expensive, require significant preparation of the substrate, and none offer the required long-term, low maintenance protection. Past coating efforts have primarily used relatively thick coatings (1-20 mils thick) to combat salt corrosion. Anodizing of aluminum and chromate conversion coating of aluminum and ferrous alloys are the most effective technologies, but both are environmentally unfriendly and require the use of toxic chemicals. Corrosion often occurs in areas of surface defects of the alloy substrate. Pits and inhomogeneities in the alloy composition cause accelerated corrosion. High strength aluminum alloys in particular are subject to pitting corrosion because of the influence of Cu-containing intermetallic particles. The inhomogeneous distribution of Cu in the alloy microstructure has been shown to be a major cause for low resistance to pitting or stress corrosion cracking. Heterogeneous microstructures are intentionally developed in commercial aluminum alloys to optimize mechanical properties. Unfortunately, such microstructures make aluminum alloys susceptible to localized corrosion during service and complicate aqueous surface finishing processes. The standard coating system uses a chromate conversion layer covered by organic paints. Short term corrosion protection of metals and alloys from corrosion due to moisture and other environmental factors is currently achieved using organic layers. Time-consuming and arduous, these organic coatings need to be removed before the processing of metals and alloys like heating or melting or for painting and other surface modifications.

Many metals, alloys and ceramics used in various applications require a smooth surface finish which is often accomplished by mechanical or chemical mechanical polishing means. In addition to passivation of coated surfaces, it is also desired to protect them from any environmental attack during processing or surface modification or during service. Typically, anodization of the surface with the formation of an alumina or chromia film is done to passivate the surfaces. However, the aforementioned procedures are expensive, labor intensive, and are environmentally unsafe releasing toxic substances and generating toxic waste.

Physical vapor deposition (PVD) grown amorphous silicon nitride film on metallic substrates are used for growth of single crystal magnesium oxide films using ion-beam assisted deposition (IBAD) whereby the growth is induced by e-beam evaporation, sputtering or other PVD method with another ion-beam to induce crystallographic alignment. Using this technique, biaxial texture of magnesium oxide is attained over thicknesses within 100 Angstroms as opposed to direct IBAD growth of yttria stabilized zirconia (YSZ) on highly polished polycrystalline metal or alloy substrates (hereafter referred to as metal substrates) which required growing much thicker films (over 1000 Angstroms) to attain similar quality biaxial texture. The IBAD magnesium oxide films served as good templates for further heteroepitaxial growth of functional oxide films such as ferroelectrics, superconductors, piezoelectric films, or other electronic films of the like. Thus, the IBAD MgO approach served as a much faster and economical way of producing biaxially textured or single crystal films on polycrystalline metal substrates with amorphous interlayers (also known as nucleation or adhesion layers).

It has been recently demonstrated that yttria served as a much better amorphous template layer (grown by PVD) than silicon nitride on highly polished metal/alloy substrates. Specifically, the yttria/IBAD MgO approach was used to demonstrate the architecture for growth of high quality High Temperature Superconductor (HTS) films suitable as HTS coated conductors. Specific disadvantages of this approach include: an expensive (vacuum deposition process) low deposition rate process is required for yttria amorphous layer formation, the use of thin yttria layer is not an adequate diffusion barrier against diffusion of oxygen and other metals to diffuse into the superconducting layer; thus, a separate diffusion barrier layer is still required (currently strontium ruthenate is being used as diffusion barrier), and prior to deposition of yttria, the substrate roughness needs to be tailored below 40 angstroms (preferably below 10 Angstroms) through mechanical or electrical polishing methods. Thus there is a need for an alternative material and associated thin film process (preferably non-vacuum, low-cost, and high deposition rate) to replace yttria and silicon nitride or other layers which is multifunctional and performs better and can be deposited at lower costs using a simple deposition process.

Low friction surfaces are required for many applications, including bearings, bearing races, and gears. Low friction surfaces can be imparted by depositing a low-friction material as a coating or reducing the overall surface roughness of the substrate. Although surface finish of metallic and ceramic parts can be improved through mechanical polishing, pits and defects contained on the surface cannot be effectively removed through any of the standard polishing techniques. Deposition of extremely thin amorphous films that exhibit low surface energy and provide hermetic coverage with adequate thermal and microstructural stability can be beneficial in maintaining a low friction surface whereby the defects on the metal surfaces are effectively sealed.

Biofouling of ship hulls is caused by microorganisms such as slime, algae and bacteria, and macroorganisms such as barnacles, mussels, clams and oysters which adhere to the hull of the ship. Fouling increases drag on the hull, decreasing ship speed and often significantly reducing fuel economy. One of the promising emerging technologies is the nontoxic "foul-release" coating. These coatings are based on the hypothesis that in surfaces with the weakest attraction for bio-organisms, fouling will be slow and likely to require the least amount of effort to release from the surface. Fouling organisms adhere to the surfaces by secreting proteinaceous adhesives. Materials with low surface energy will offer low adhesion strength, resulting in poor attachment and easy to remove fouling. The feasibility of this approach has been established by researchers using fluorinated polymers, epoxy based and silicone-based coatings. These coatings did foul, but fouling bio-mass can be easily removed by fast-flowing water. However, these polymer-based coatings have limited heat and UV light resistance. Therefore, an inorganic coating with smooth and low friction surface properties are highly desirable.

Microarrays are arrays of biomolecules such as oligonucleotides that are spatially arranged and stably attached to a surface of a solid support. Microarray technology is used for parallel analysis of genes in a large scale, and has emerged as the universal genetic analytical tool for use in a wide range of biomedical applications. Commercial production of DNA chips has been implemented by many companies while, in parallel, medical researchers report exciting advances across many disciplines within the field of medicine. These developments in microarray technology offer tremendous promise to solving long-standing problems in public health worldwide and also provide new avenues to combat the more recent threats of bioterrorism.

The starting point or the basic building block for producing biomolecular microarrays is a suitable solid template surface (solid support material) upon which biological molecules can be anchored or immobilized. Several patents have been issued on functionalizing silicate glass and other surfaces. Numerous other surface coatings have also been disclosed. Patents are also awarded for novel solid supports, e.g. aluminosilicate, for immobilizing nucleic acids. Characteristics of DNA microarrays are determined by the surface properties such as chemical homogeneity, interaction between surface and bio-molecules, surface roughness, density of surface functionality, spacing between surface functional moieties, amenability to DNA hybridization, and so forth. While the current methods employ the use of soda-lime glass substrates, they are prone to degradation over the long term and the surface chemistry is not tailored to allow for suitable organic attachments. An organic linker is used to attach the DNA or other biomolecule to the surface of the substrate. Polylysine is a coating material currently recommended and one of several used for glass slide preparation, as known in the art. However, polylysine-coated glass slides suffer from poor stability, extended curing cycles, and poor reliability such that new surface methodologies are critically needed to support the rapidly growing field of microarray technology. For example, polylysine-coated slides need to be stored for 14 days after coating for curing purposes and should be used within four months due to degradation from oxidation. Typically, in a batch of polylysine-coated slides, several are rejected because of non-uniformity or opacity. In addition, the hybridized microarrays cannot be stored over long time periods. Stability of polylysine coating under UV light is also a concern.

Many alternative coatings to replace polylysine are being investigated including aminosilanes, epoxy derivatives, aldehydes, and others. While aminosilanes or their derivatives offer superior stability, their low binding capacity has been a problem. Many of these limitations stem from the lack of desirable inorganic surface chemistry for bonding with organics. Organic groups functionalized on soda-lime glass surfaces are not stable under even slightly harsh conditions or chemical treatments and will degrade over time. Organic molecules interact only weakly with soda-lime-silica surfaces. Under humid or other conditions, sodium ions diffuse to the surface of the glass and interact with organic molecules resulting in degradation. Borosilicate or aluminosilicate glasses have also been proposed, but they do not offer the ideal surface chemistry for organic absorption.

Disinfecting and antimicrobial chemicals are commonly employed to eradicate microbial growth and improve hygiene. The adhesion of micro-organisms to surfaces is influenced by the bio-adhesive characteristics of the fouling organism and surface properties, such as its chemical composition and physical characteristics of the surfaces like surface roughness. Fungi, such as molds, yeasts and algae are visible in mass, but it can be advantageous to eliminate them earlier, when contamination and the consequential substrate deterioration has not yet become obvious. Highly active cleaning chemicals may be toxic and aggressive and, after repeated applications, degrade the surface and inactivate bioactive systems. Another major problem is the evolution of microbial strains which are resistant to disinfectants and antimicrobial agents that are being used now. The issue of hygiene is especially critical to contact surfaces present in food processing, supply and catering chains, health and medical establishments, animal husbandry, water and sewage operations as well as in heating, ventilation and air conditioning systems.

The performance factors of antimicrobial coatings include durability, retention of activity, and minimal degradation of surface characteristics and appearance. The coatings must also show resistance to heat, chemicals, solvents, staining, scratching, and moist environments. They should preferably be non-toxic, odorless, smooth, non-porous, easy or self clean, crack-free, avoid discoloration, have good color retention and be UV resistant. Several potential novel techniques are being developed to overcome these problems. These include albumin affinity surfaces, surface modification with blue dextran, silver ion incorporation in a porous matrix, photocatalytic titanium dioxide, silicone quarternary ammonium compounds and sacrificial coatings that are alkali soluble or strippable and recyclable films. A multi-layer film, fluoro/silicon containing resins, a dry paint film with additive coating or additives incorporated, the incorporation of cleaning agent activators, the design of surface and cleansing system in tandem, tuned ultraviolet, ultrasound and ozone could also be of value.

Among these antimicrobial techniques, there is a renewed interest in silver ion incorporation into coatings and substrates by researchers and companies. Several patents and publications have recently appeared on the use silver ion incorporated substrates like zeolites, polymers, ceramic sheets and polyelectrolyte films. Silver compounds have been exploited for their medicinal properties for centuries. It is an effective agent with low toxicity. Although silver salts are effective antimicrobial agents, their use likely results in unwanted adsorption of silver ions in epidermis cells and sweat glands. To reduce the likelihood of silver-ion adsorption into tissue, silver ions need to be incorporated into stable substrates.

The hydrophobic effect plays an important role in the defense against pathogens. In addition to the unfavorable surface energy on the hydrophobic surfaces, microorganisms are also deprived of the water necessary for germination and growth. Very few microorganisms are known to survive in the absence of water. Hence, hydrophobic property imparted on inventive material coated surfaces may be regarded as the additional defense against microbes. The combined effect of both bactericidal and hydrophobic properties of inventive material coating will act as two lines of defense against harmful microorganisms. A hydrophobic layer will prevent or reduce the adhesion of microbials and help in easy cleaning. In case of damage occurring to this hydrophobic layer during service the antimicrobial agent loaded second layer will act as second line of defense against microbes. Fiberglass insulation is used extensively in building construction. Fiberglass is an effective insulation, but is susceptible to moisture and can become a point for bacteria and mold to grow. Mold and bacteria growth in building materials causes indoor air pollution and can cause sickness in the inhabitants of the building. A water-repellent coating is desired to maintain dry conditions of the fiberglass insulation. If the fiberglass is dry, then biological growth can be prevented. Therefore, the combination of both hydrophobic and antibacterial property in one embodiment will greatly help in situation like this and others.

SUMMARY OF THE INVENTION

In light of the foregoing, it is an object of the present invention to provide aluminophosphate compounds, compositions and/or related composites or articles, together with methods for their use and preparation, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

For purposes of the present invention, the phrase "inventive material," mention thereof or reference thereto will be understood to mean any of the present aluminophosphate compounds or compositions, over the entire available range of Al:P stoichiometries, as may be used in conjunction with a method, composite, or article of this invention, and/or a film, layer or coating associated therewith, or as otherwise provided below, such compounds or compositions prepared or characterized as described herein, such compounds and compositions as may be alternatively expressed, respectively, as aluminum phosphate compounds and compositions, and prepared, characterized and/or applied as described in U.S. Pat. Nos. 6,036,762 and 6,461,415 and co-pending application Ser. Nos. 10/627,194 and PCT/US03/36976, filed Jul. 24, 2003 and Nov. 19, 2003, respectively, and 10/642,069 and PCT/US03/25542 filed Aug. 14, 2003, each of which is incorporated herein by reference in its entirety. Without limitation, as described herein and/or through one or more of the aforementioned incorporated patents or applications, the inventive material can include such aluminophosphate compounds and compositions comprising dopants, particles and/or inclusions of carbon, silicon, metals, metal oxides and/or other metal ions/salts—including nonoxides—regardless of whether the aluminum content is stoichiometric, less than stoichiometric or greater than stoichiometric relative to phosphorous, on a molar basis. Embodiments of the inventive materials are available under the Cerablak trademark from Applied Thin Films, Inc.

The inventive material comprises aluminophosphate and can be deposited as a thin film on substrates using a specially-designed precursor solution that yields a unique form of amorphous aluminum phosphate. U.S. Pat. Nos. 6,036,762 and 6,461,415 issued to Sambasivan et. al and the above-referenced patent applications provide details regarding the precursor synthesis and chemistry, properties, and other processing details are provided. Various additions or modifications to surfaces coated with the inventive material are also considered embodiments of the present invention, examples of which are provided below.

One of the objects of the invention is to provide a method to deposit this inventive material coating as a thin, hermetic, microstructurally dense, uniform, and transparent coating using simple dip, spin, spray, brush or flow coating process. It is an object of the invention is to use inventive material coatings to passivate and protect metals and alloys from oxidation and corrosion during processing and service at room and elevated temperatures. Another object of the invention is to use the present inventive material in conjunction with other coating materials. For example, along with copper-chromium alloy coatings, the inventive material coating can be used to protect against oxidation of advanced copper-niobium alloys with less chromium content.

It is a further object of the invention to planarize metal and alloy surfaces such that the smoothness of the resulting surface is beneficial for rendering a low-friction surface which should provide, for example, better wear characteristics. The planarized surface may also be suitable for further deposition of other functional layer(s) above, over or on top of the inventive material coating whereby the substrate is protected during processing of subsequent layers and the planarized surface provides better quality overlayers. The smooth surface obtained due to the planarization effect of the coating is also beneficial as foul-release coatings for marine utilities.

Another object of the invention is that coatings of the inventive material applied to metal, alloys, ceramic or glass surfaces can be imparted with additional functions including but not limited to hydrophobic, hydrophilic, antimicrobial, optical, low-friction, anti-fouling, easy foul-releasing, mechanical and self-cleaning properties by an additional layer of organic molecules. Such surface modification of metal and alloy, ceramics and glass surfaces with a substantially pore-free and smooth inorganic film which is highly stable and with the additional organic layer make the surface multifunctional and can provide a comprehensive method of protection and other broad range of applications.

Another object of present invention is to preferentially attach or couple biomolecules and other organic molecules to films or components of the inventive material, such molecules including, but not limited to, polypeptides, polynucleotides or nucleic acids onto inventive material surface, which is preferably obtained as a coating on a solid support.

It is another objective of this invention to tailor the inventive material coated surfaces with attachment of organic or inorganic or combined molecules including, but not limited, to alkyl amines, carboxylic acids and organosilanes. It is another objective of this invention to use organic linker molecules attached to inventive material surface for biomolecular array preparation. It is another object of this invention to provide a mask layer over inventive material layer, which can be selectively removed chemically or photochemically. It is another object of this invention to reduce or eliminate the fluorescence impurities present in the solid substrates which interfere in DNA hybridization analysis. It is another objective of this invention to use inventive material coating as barrier for interaction of attached biomolecules with detrimental species such as sodium ions present in the substrates like soda-lime glasses. It is another objective of this invention to tailor the hydrophobicity of the inventive material surface coated on solid substrates, for example, by selectively attaching suitable organic molecules. This will help in processes such as DNA spotting from spreading. It is another objective of this invention to coat the inventive material over silicon surfaces, thus allowing the integration with DNA chip technology. It is another object of this invention to mass produce suitable solid supports to clean, consistent and durable solid supports for bimolecular array. It is another object of this invention to attach functionally derivatized DNA molecules onto inventive material surface coated over solid substrates. It is another object of this invention to modify conventional solid substrates including but not limited to glass slides to be applied for preparing consistent, clean, uniform, durable, and hard surfaces suitable for microarrays.

Another object of present invention is to use inventive material as the substrate or carrier for organic and inorganic antimicrobial agents and in particular but not limited to silver ions. Antimicrobial agents can also be incorporated within the inventive material matrix and used as antimicrobial powder.

Another object of the present invention is the development of a low-cost, durable, antimicrobial and corrosion resistant coating material in one embodiment. Another objective is the development of silver mixed-inventive material coated surfaces with additional hydrophobic property through the attachment of a suitable organic layer. Yet another objective of the present invention is to use a porous overlayer to the inventive material coating on substrates to impart large surface area to the surface for intake of higher quantity of antimicrobial agents. The porous layer will be loaded with antimicrobial agents such as, but not limited, to silver ions. The porous layer can also be functionalized by the uptake of selective organic compounds, for example, adsorbed hinokitiol, tannin, lysozyme, protamine or sorbic acid that can be released slowly for durable antimicrobial activity.

Other objects, features, benefits and advantages of the present invention will be apparent from this summary and its descriptions of various embodiments, and will be readily apparent to those skilled in the art having knowledge of various corrosion/oxidation protection, anti-microbial, anti-biofouling and bio-microarray coatings, films and/or applications. Such objects, features, benefits and advantages will be apparent from the above as taken into conjunction with the accompanying descriptions, examples, data, figures and all reasonable inferences to be drawn therefrom, alone or with consideration of the references incorporated herein. These and other objectives, advantages, and features of the invention will become apparent to those skilled in the art upon reading the details of the invention as more fully described below.

In accordance with the preceding and the inventive materials referenced above and described elsewhere herein, the present invention is, in part, a method of using an aluminophosphate compound to decrease surface roughness. Such a method comprises (1) providing a precursor to an aluminophosphate compound, the precursor comprising aluminum ions and phosphate esters in a fluid medium; (2) applying the precursor medium to a substrate having a first surface roughness value; and (3) treating and/or heating the applied medium for a time and at a temperature sufficient to provide a substantially amorphous aluminophosphate compound on the substrate. Application and subsequent treatment of the precursor medium, as described herein, as well as in the aforementioned incorporated references, provides a planarized substrate surface, such planarization as can be determined by a decreased, second roughness value, as compared to the aforementioned first surface roughness value. Reference is made to several figures and supporting examples. In preferred embodiments, the surface roughness value can be decreased at least by about a factor of 3. Alternatively, such a method can provide a treated substrate with a friction coefficient less than about 0.2.

A precursor to the aluminophosphate compound can be applied to the substrate using one or more techniques, as would be understood by those skilled in the art. Dip-coating can be used with good effect over a range of substrate materials and configurations. Spraying, flow-coating and spin-coating can be used with comparable effect, depending upon choice of substrate. Without limitation, a substrate used in conjunction with a method or composite of this invention can include a steel, a nickel-based alloy, a super-alloy, titanium, a titanium-based alloy, niobium, a niobium-based alloy, molybdenum, a molybdenum-based alloy, silicon, aluminum oxide, an enamel, mullite, a glass, fused silica, a silica-based refractory and a ceramic material. Likewise, for purposes of illustration and without limitation, such a substrate, in particular those comprising a metal, alloy or ceramic material, can be configured to provide a bearing, a gear, or a medical implant component.

Further demonstrating the utility of this invention, providing a suitable substrate, an aluminophosphate compound of this invention can have deposited thereon a biaxially-textured component such as but not limited to magnesium oxide, yttria and an yttria-stabilized zirconia. With such embodiments of the methodology and/or composites of this invention, a lattice-matching and/or an electromagnetic component can be deposited on such a textured component. As would be understood by those skilled in the art made aware of this invention, such an electromagnetic component can comprise a superconducting YBCO ceramic material.

In part, the present invention is also a composite comprising a substrate, a substantially amorphous aluminophosphate compound and an organic component attached to the aluminophosphate compound. Typically, the aluminophosphate compound is on the substrate, but can, optionally, be provided as an overlayer or coating on another component deposited on the substrate. Regardless, as described elsewhere herein, the organic component can comprise a compound having synthetic, clinical and/or diagnostic application. Such a biomolecule can be selected from but is not limited to a protein or an amino acid residue thereof, a polypeptide, a polynucleotide or a fragment, component or residue thereof. As discussed elsewhere herein, such a composite and associated methodology can be used for the coupling, attachment or bonding interaction with a DNA fragment or component. Such coupling or attachment of the aluminophosphate compound with a particular biomolecule can be direct or via a molecular linker component. Polylysine can be used as can other linker components known in the art to those individuals made aware of this invention, such components including a range of organosilane compounds. Examples of the latter include difunctional aminosilane compounds which can be used for the coupling or attachment of the range of biomolecules, directly or by way of synthetic modification, to the aluminophosphate compounds or compositions of this invention.

In part, the present invention can also include a substantially amorphous composition comprising an aluminophosphate compound and an antimicrobial component. Without limitation, the antimicrobial component can be selected from silver, copper, zinc and iron ions. Regardless, such an antimicrobial component can be incorporated into such a composition over a range of effective concentrations. However, depending upon desired effect, the ratio of antimicrobial to aluminophosphate component can range from about 0.1:1 to about 1:1. As described elsewhere herein, such a composition can be applied or deposited on a substrate, such a composite can further comprise one or more organic components to provide additional functional effect. Without limitation, such an organic component can be selected from a fatty acid or a silane compound to provide enhanced hydrophopicity. Alternatively, enhanced effect can be achieved through choice of an appropriate detergent or surfactant component, with incorporation of the metal cations to provide antimicrobial effect and the organic anion to enhance hydrophopicity.

BRIEF DESCRIPTION OF THE DRAWINGS

FIG. 2A shows how the inventive material can be used in the current architecture. FIG. 2B shows how the inventive material can be used to reduce or eliminate the need for the diffusion layer (d).

DETAILED DESCRIPTION OF CERTAIN EMBODIMENTS OF THE INVENTION

As mentioned above, the present invention relates to an aluminophosphate compound/composition with a variable aluminum to phosphorus ratio which is stable to high temperature. Without limitation, the molar ratio of aluminum to phosphorus can range from about 0.5:1 to about 10:1, preferably ranging from about 1:1 to about 4:1, most preferably ranging from about 1:1 to about 2:1. Films, layers and/or components of the inventive material are available using an inexpensive chemical precursor solution that deposits a uniform, hermetic, transparent thin film by a simple dip, paint, spray or flow coating process, such precursor(s) and methods of deposit as are more fully described in the aforementioned patent and application references.

Figure 1:
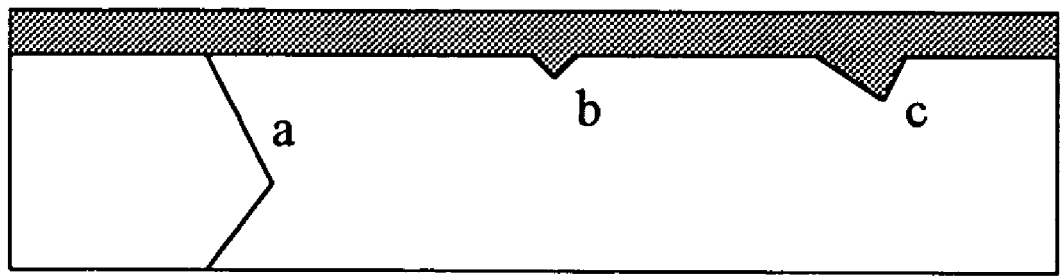
FIG. 1. Schematic figure showing the ability of the microstructurally dense and hermetic inventive material coating to seal off surface defects and grain boundaries on a metal or alloy specimen. (a) indicates a grain boundary, (b) indicates a pit and (c) indicates a scratch in the surface. The inventive material coating effectively seals such defects.

Present inventive material offers a) excellent protection against oxidation, b) the formation of stable protective oxide scales, and c) adequate sealing of defects (such as pits) on alloy surfaces such that accelerated oxidation is prevented during the early stages of exposure (see FIG. 1 for a schematic representation of the effect of inventive material coating metal and alloy substrates). Among these, the most relevant and innovative attribute, without wishing to be bound by theory, is the ability of the inventive material to promote formation of a dense, continuous and protective oxide scale underneath during early stages of oxidation. It is apparent from studies on stainless steel that a dense chromia-rich scale is formed preferentially in coated materials compared to a highly porous iron-rich scale for uncoated specimens. In the latter case, extensive oxidation is observed with subsequent spallation of the scales. An order of magnitude difference in oxide scale thickness was observed between coated and uncoated AUS 304 substrate coupons.

Inventive material coatings on nickel-based superalloys and titanium alloys may extend turbine lifetimes, limit failure, and allow higher operational temperatures with minimal additional cost. Inventive material coating on alloy foils reduces oxidation and corrosion which may find application with metal foil catalytic converters. In addition, a component (e.g., a film) of the inventive material may be used to protect other alloy and metal specimens from oxidation and corrosion. The coating process is simple, scalable, and amenable to field repair. Protection from oxidation at elevated temperatures has been demonstrated for a number of alloy substrates including titanium alloys, nickel-based alloys, steel, cast iron, and inconel.

In addition to protecting alloys from oxidation during service conditions, the present inventive material can be used to protect alloys from oxidation during hot forming. Metals and alloys are sometimes heated (strengthening or case hardening) for forming to produce a specific shape for future use. The mechanism of protection is the same as protection at use conditions, although the heat treatment is relatively short (a few minutes to hours), and the coated alloy may or may not be intended for use at high temperature.

In addition to depositing the coating using a clear precursor solution, powders can be made and dispersed in the solution to form a slurry coating. The coating is then applied in the same manner as the clear solution. Powders can also be thermal sprayed onto a substrate. Black, gray color of various shades or white powders of the inventive material can be used as pigments and dispersed in a paint medium and used in coating surfaces.

The inventive material coating can be used as part of a multilayered coating system. Coatings of other compositions can be deposited either underneath or over the inventive material coating. One example of this embodiment of the invention is the use of inventive material coating as an oxidation barrier between an alloy substrate and a thermal barrier coating. Thermal barrier coatings are used to reduce the temperature of an alloy substrate, but do not offer significant oxidation protection. A component coating of the inventive material can be applied underneath the thermal barrier coating to reduce oxidation of the substrate.

The inventive material can be used as multilayers to tailor desired properties with varying chemistries or microstructrures in each layer to form a functionally-graded structure or to produce thicker layers to increase the protection ability against corrosion and anti-tarnishing. The inventive material coating can be used to retain or improve the heat and light reflectivity of coated surfaces substantially at low as well as elevated temperatures.

The planarization induced by inventive material will be useful for a number of applications including those requiring wear resistance or low friction surfaces. In addition, the smooth amorphous surface can also serve as a template (due to better adhesion characteristics with deposited overlayers of organic or polymeric or ceramic materials) for growth of additional layers for adding functionality. For example, amorphous template layers are desired for growth of textured films for electronic applications. In particular, growth of biaxially textured superconductor films is desired for long length high temperature superconducting (HTS) tapes. Several patents have been issued related to using ion beam assisted deposition (IBAD) to create a biaxially textured oxide template on metal/alloy or amorphous (silica/Si) substrates, including U.S. Pat. Nos. 6,383,989 and 6,312,819, each of which is incorporated herein by reference.

Presently, both silicon nitride and yttria are used as amorphous "nucleation" or "adhesion" in the IBAD or Inclined Substrate Deposition (ISD) approaches. Thus, there is a need for an alternative material and associated thin film process (preferably non-vacuum, low-cost, and high deposition rate) to replace yttria and silicon nitride or other layers which is multifunctional and performs better and can be deposited at reduced costs. Inventive material produced using a dip-coating or other solution-based process offers an excellent opportunity to replace existing amorphous template technologies for IBAD film growth. By a simple dip-coating process, the inventive material can be deposited as a microstructurally dense, hermetic, thin (50 nm-1 μm), pin-hole free, uniform, and smooth film at relatively high rates in one pass. The inventive material coating is a better alternative because of the low cost coating process, high throughput, thermally stable and durable nature of the coating, and will provide excellent protection to substrate, but may also be suitable for etching to pattern the semiconductor layers for solar array applications.

Figure 2:
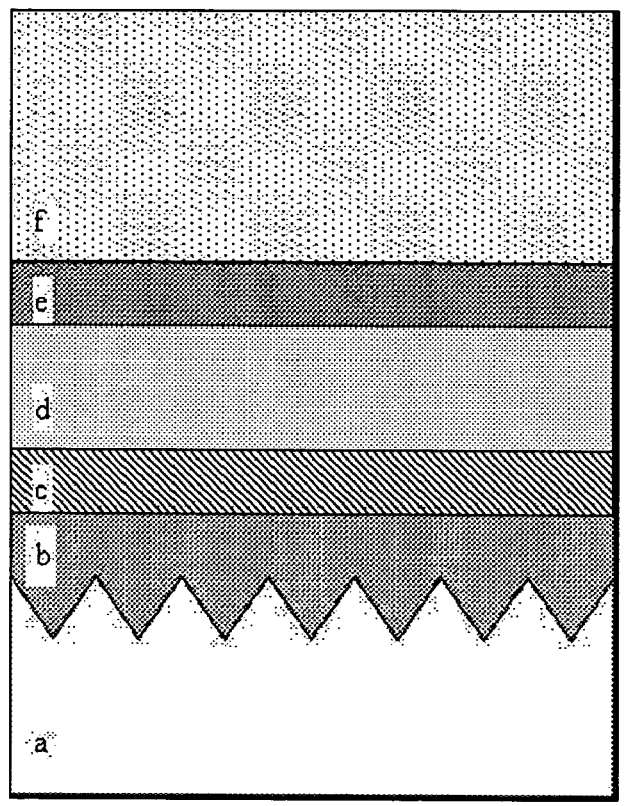
FIG. 2. Schematics showing typical architecture to develop HTS films on a metal substrate. The respective layers are (a) polycrystalline metal or alloy substrate, including but not limited to Inconel, stainless steel, I-624, and nickel chromium alloys, (b) an inventive material coating, for passivating and planarizing the substrate, (c) IBAD MgO or YSZ, (d) homoepitaxial MgO or YSZ, (e) $CeO_2$ and (f) HTS layer.
Figure 2:
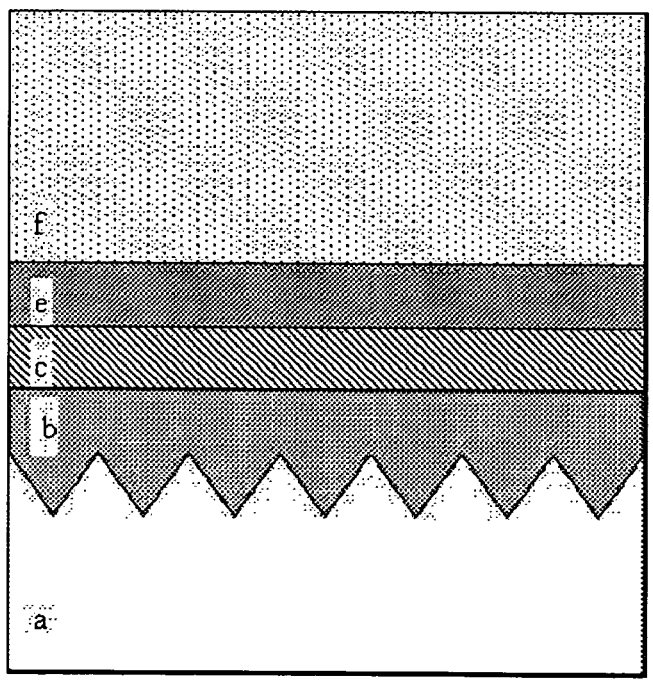

Inventive material coatings suitable as an IBAD template layer have several advantages over current technology. As a hermetic coating, the inventive material seals off pits, scratches, and other defects typically found even on well-polished substrates which can be corrosion-active and may affect the texture quality of IBAD film in those areas. Deposition of inventive material on metal or alloy or ceramic surfaces also induces a planarizing or smoothening effect so that the surface roughness can be significantly reduced which may allow for reduced polishing effort. Inventive material is a highly inert and stable high temperature material with low oxygen diffusivity. The diffusion barrier characteristics are very important so that diffusion of metal species into the functional oxide layer is limited during high temperature growth of the oxide layer. Typically, the multilayer stack will contain a buffer layer on top of the IBAD layer to prevent diffusion of metal species into the functional layer (See FIG. 2, for the schematics showing typical architecture to develop HTS films on a metal substrate).

Thus, the inventive material can serve as an excellent template for IBAD growth for a number of applications including, but not limited to, HTS coated conductors, ferroelectrics, piezoelectrics, optoelectronics or electro-optics. It also has a low dielectric constant so that it can be integrated easily into silicon-based technology and used as a gate dielectric layer for silicon-based semiconductors. Biaxially textured or single crystal films of piezoelectric ceramics are being targeted for adaptive and flexible structures for aerospace and other applications. The inventive material deposited on flexible metal/alloy foil substrates will offer corrosion and oxidation resistance while serving as a stable and inert template for IBAD growth of piezoelectric films, thus creating a stable adaptive wing or other structures with high electromechanical coupling (due to high quality texture) produced at much lower costs as compared to current methods. The IBAD process can also be used to produce single crystal or biaxially textured films on flexible metal foil substrates suitable for solar cell applications. Single crystal germanium and GaAs layers are desired on metal foil substrates for solar arrays. The current approach is to use polycrystalline semiconductor layers on metal or polymer substrates, limiting the solar conversion efficiencies. The IBAD approach may be ideally suited to produce textured layers.

Growth of epitaxial conductive oxide electrode layers is desired on amorphous substrates (such as ruthenium oxide) for use in actuators and other devices; inventive material can serve as an excellent template on silicon. Although thermally grown silica films on silicon may be suitable for the same purpose, growing a 100 nm silica scale on silicon by thermal oxidation require very high temperature processing and long scale formation times which also induces stresses so that the microstructure and morphology of the oxide scale is not optimal for subsequent growth of oxides. With the inventive material, at a low deposition temperature, a nominal 100 nm thick film, which is uniform, hermetic, and dense can be grown within few minutes by curing above 350-500° C.

Planarization can be induced on relatively rough surfaces by depositing multiple layers of coatings of the inventive material, where each coating has a lower surface roughness than the coating underneath. Coatings of the inventive material were deposited on 4340 steel coupons and the friction coefficient was found to be ~0.1-0.14. In addition to the low friction properties, the inventive material has a low surface energy of 32 dyne/cm. With organic molecules attached to the inventive material surface, the surface energy can be lowered even further.

Figure 3:
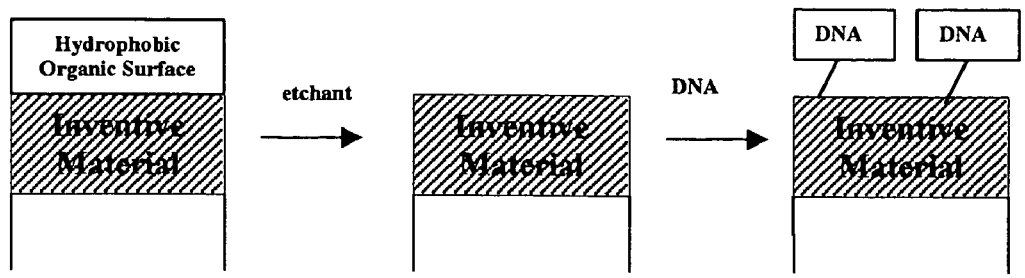
FIG. 3. Schematic showing the immobilization of biomolecules on inventive material coated on solid substrates.

The surface of inventive material coatings can be further tailored by the purposeful deposition of organic overlayers. The use of functional organic overlayers on metal or alloy substrates has many applications, including but not limited to the use of organic catalysts on metal reactor vessels. Without wishing to bound by any theory the adsorption of organics may result from the presence of active adsorption sites on the inventive material surface. These active organic attachment sites may be attributed to the presence of unsaturated aluminum ions (bonded to three or less oxygen atoms) or P doublebond O moieties (P=O), or Al—OH and/or P—OH groups on the surface of the inventive material. Further Al—O—Al and Al—O—P bridging groups, present on the surface resulting from the pyrolysis of the precursor solution can also render the inventive material highly reactive. Molecular water, alcohol, acetone or ether can dissociatively adsorb on these sites upon atmospheric exposure resulting in reactive Al—OH and P—OH groups. These reactive hydroxyl groups can also be formed on the inventive material surface purposely by treating with dilute acid or other chemical methods that are familiar to those skilled in art. The organic attachment is very stable and durable toward subsequent chemical, thermal, and mechanical treatments Thus, the inventive material offers a new and unique glass surface chemistry which has tremendous promise for use in biomolecule immobilization. The attractive attributes of inventive material include the nature of the glassy material and the simple dip coating process used to develop a thin, uniform, dense, hermetic, and transparent film (see FIG. 3, for a schematic representation of microarray using inventive material coated substrates). The coating also provides the benefit to seal off any surface flaws or defects, thus providing a very uniform and consistent surface chemistry which is essential for microarray and other biotechnological applications.

Another aspect of this invention is the preservation of an inorganic surface prior to biomolecular deposition. Normal procedures for using soda lime glasses include extensive cleaning and inspection of surfaces to ensure scratch and contaminant-free surfaces prior to polylysine deposition. These procedures are tedious and time-consuming and are prone to manual errors and can cause unknown failures on precious DNA samples and hence raises concern with the current approach. In comparison, immediately after forming inventive material coatings, they can be masked with a surfactant layer which may include but is not limited to oleic acid layers, which provide excellent coverage and a hydrophobic surface which repels water and other contaminants (non-stick coating). These masked layers can be easily removed just prior to organic deposition such that a pristine surface of the inventive material is exposed for producing consistent and high quality organic or biomolecular overlayers. Such an approach cannot be used to protect sodalime glasses since the bonding with organics is fairly weak and surfaces tend to get hydroxylated to form silanol groups as opposed to organic adsorption. High quality coatings of the inventive material with organic layers on glass can also provide self-cleaning glass products suited for architectural windows and automotive applications.

Two other alternative approaches are possible for attachment of biomolecules on an inventive material surface. One method involves developing a suitable organic anchor layer which has functional groups for subsequent bonding with DNA or other biomolecules. The coupling, attachment and/or bonding of the organic layer with an inventive material coating is fairly robust as it can be tailored with a carboxylic or amino terminating groups. A second alternative is to use the inventive material as a stable buffer layer for use in conjunction with linker molecules, compounds or moieties including the currently-used polylysine-based coating systems. The compounds/compositions offer important benefits of this invention compared to the current system via providing a chemically inert surface, strong bonding with polylysine, and superior surface morphology not limited to smooth, dense, and nearly defect-free surface.

The inventive material and/or precursor solution with metal cations including, but not limited to silver, copper and zinc can be used in antimicrobial coatings. Inventive material mixed with antimicrobial agents coated surface can act as antimicrobial on contact. Organic antimicrobial agents can also be attached onto the inventive material surface owing to the strong and unique affinity of inventive material for organic molecules. Antimicrobial agents not limited to antimicrobial surfactants can also be adsorbed on to surfaces coated with inventive material. These will act both as antimicrobial and hydrophobic surfaces. End groups of surfactants can be alkyl, or trifluro alkyl groups. Trifluro end groups are preferred for higher hydrophobicity. Dry conditions because of a hydrophobic surface will help in preventing microbial growth. Metal cation salts of surfactants not limited to silver salts of acid surfactants (e.g. silver salt of oleic acid) can also be used as the adsorption layer on the inventive material coating to enhance the antimicrobial activity. Not wishing to be bound by any theory, it is believed that the carboxyl group is attached to aluminum cation and silver ion to phosphate group. Since the inventive material can be coated by a simple process, and not limited to dip coating, on a variety of substrates, several fields of applications can be exploited. Applications of antimicrobial coatings are listed in Table 1. These are only representative examples and not exhaustive list of potential applications of the present invention.

TABLE 1

| Property | Substrates | Applications |
| --- | --- | --- |
| Antimicrobial, Anchoring substrate | Glass | Windows, Cell Cultures, Micro array Protein adsorption |

TABLE 1-continued

| Property | Substrates | Applications |
| --- | --- | --- |
| Antimicrobial, and corrosion | Steel | Building Construction (push-plates, kick-plates, towel dispensers, escalators, door knobs, light fixtures, bath room components, Air-handling duct systems) |
| Antimicrobial | Aluminum | Serving trays, salad bars, Refrigerators, Coolers, Food packaging. |
| Antimicrobial | Floor Tiles | Serving counters, food preparation surfaces, animal shelters |
| Antimicrobial | Ti and Ti-based alloys, Stainless steel, Platinum, Nitinol | Surgical instruments, Catheters, Guidewires, Introducers, Shunts, Tubes, Endoscopes, Blades, Needles, Coiling wire, PTCA stylets, Mandrel wire |
| Microbially Influenced Corrosion (& salt corrosion) | Marine/ Aquaculture | Against growth of bacteria, algae, fungus, mold, and mildew under water (swimming pool) |

For some applications, it is possible to tailor the inventive material composition to alter its mechanical (nanocomposite films), thermal (improve conductivity through inclusions), electrical (add cationic solutions to precursor to improve electrical conductivity), optical, chemical properties, and biological properties (antimicrobial) thus enhancing the product capabilities and performance. In the case of metallic surfaces, bioactive inventive material surfaces can serve dual purpose: corrosion resistance and antimicrobial coating. Such multifunctional coatings are highly desired. Other approaches include forming a porous layer of aluminum phosphate layer over a hermetic coating of the inventive material. The porous layer can be loaded with a desired amount of antimicrobial agents including, but not limited to, organic antimicrobial agents such as hinokitiol, tannin, lysozyme, protamine and sorbic acid and inorganic ions such as silver, copper or zinc. These agents can be released slowly for antimicrobial activity. Silver ion embedded in an inventive material coating on glass substrate showed antibacterial activity against *E.coli* bacteria preventing the growth of the bacteria around the coated glass surface. This property can be exploited in destroying microbes or preventing the growth thereof.

EXAMPLES OF THE INVENTION

The following non-limiting examples and data illustrate various aspects and features relating to the compounds, compositions, composites, articles and/or methods of the present invention. In comparison with the prior art, the present compounds, compositions and/or methods provide results and data which are surprising, unexpected and contrary thereto. While the utility of this invention is illustrated through the use of several aluminophosphate compounds/compositions and films/coatings thereof, it will be understood by those skilled in the art that comparable results are obtainable with various other compounds, compositions and stoichiometries, as are commensurate with the scope of this invention.

Example 1

A preferred method for depositing a component film/coating of the inventive material coating is with a clear chemical precursor solution, with the solution preferably containing an aluminum salt and phosphate esters in an organic solvent. A solution used to deposit inventive material coatings with a 2 to 1 molar ratio of aluminum to phosphorus is made by dissolving 264 g of Al(NO$_3$)$_3$.9H$_2$O in 300 mL ethanol. In a separate container, 25 g P$_2$O$_5$ is dissolved in 100 mL ethanol. These solutions are mixed together. The resulting solution is diluted with ethanol to a concentration of about 0.2 moles Al/L solution.

Example 2

Figure 4:
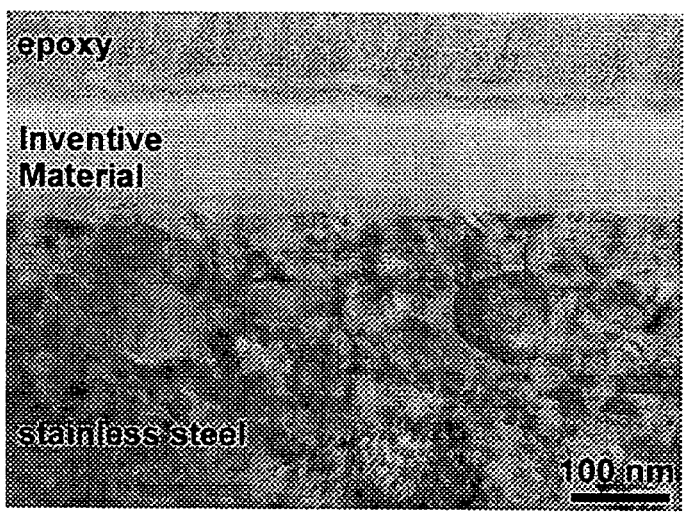
FIG. 4. Cross-sectional transmission electron micrograph showing a well-adherent, thin, uniform, dense and hermetic film of the inventive material deposited on the 304 stainless steel.

1"×2" 304 stainless steel foil is coated with the precursor solution of Example 1. The sample is heated at 500° C. for 15 minutes in a preheated furnace. A small part of this heat treated sample is prepared for transmission electron microscopic study of cross section of the inventive material coating on the substrate. FIG. 4 shows the thickness of the coating to be about 100 mn. The inventive material coating is well-adhered to the stainless steel surface, and the micrograph demonstrates the continuous, dense and hermetic nature of the coating.

Example 3

Figure 5:
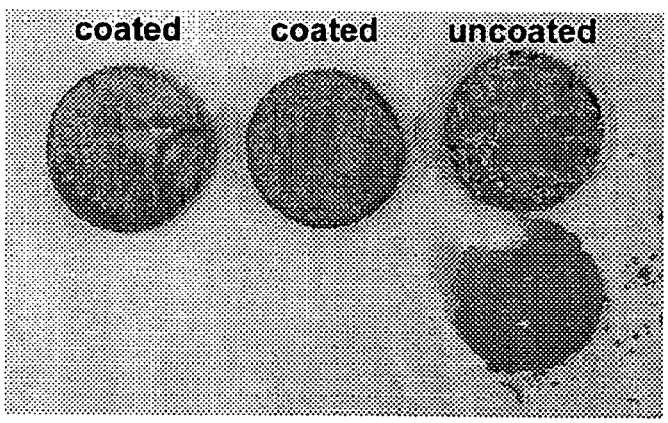
FIG. 5. Photograph of coated and uncoated Ti-46 alloy after 100 hours of exposure at 800° C. in ambient air showing the oxidation protection ability of the inventive material.
Figure 6:
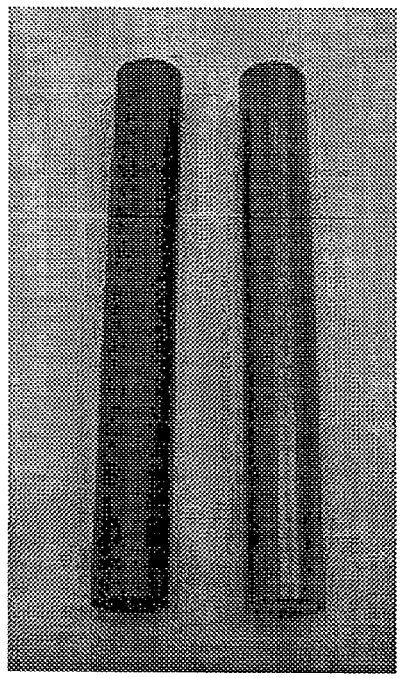
FIG. 6. Photograph of uncoated and coated nickel rods exposed at 550° C. for 115 hours in ambient air. Higher reflectivity for the coated nickel relative to uncoated sample is readily apparent. A coating of the inventive material not only provides the desired oxidation protection, but the hermetic nature of the coating also provides protection of the substrate from environmental attack during service from various contaminants in the atmosphere such as sulfur, chlorine, acids, salt, and moisture.

Titanium-based alloys tend to oxidize readily, causing changes in the desired properties of the alloy. Titanium can be alloyed with other elements (aluminum, for example) to increase oxidation resistance, but mechanical properties may suffer. An ultra-thin coating which can protect titanium alloys from oxidation is greatly desired. The inventive material has been shown to protect titanium aluminide alloys from oxidation. The solution described in Example 1 is deposited on a Ti-46Al coupon and cured by heating at 600° C. for 2 minutes. Samples coated by this method were exposed to 800° C. in ambient air for 100 hours, along with an uncoated sample. The weight change from oxidation was significantly lower for the coated specimens. FIG. 5 shows a photograph of coated and uncoated samples after the test.

Weight change after 800° C., 100 hour exposure in ambient air (mg/cm$^2$)

| | |
|---|---|
| coated sample 1 | 0.000034 |
| coated sample 2 | 0.000033 |
| uncoated sample | 0.017 |

Example 4

A coupon of Ti-6Al-4V was dipped into a chemical precursor solution as described in Example 1. The coating was dried with cool air and heat treated at 600° C. for 2 minutes in a preheated furnace. The coupons were then exposed to ambient air at 800° C. for 100 hours. The weight change from oxidation was orders of magnitude lower for the coated specimen.

Weight change after 800° C., 100 hour exposure in ambient air (mg/cm$^2$)

| | |
|---|---|
| coated sample | 0.000077 |
| uncoated sample | 0.027 |

Example 5

Oxidation protection of nickel has been demonstrated with a film/coating component of the inventive material. The coating will help passivate the nickel or nickel alloy substrate such that protection against high temperature oxidation or protection against corrosive environments such as salty or sulfur or chlorine-containing atmospheres, is imparted. A nickel rod was dipped into a chemical precursor solution as described in Example 1 and dried in flowing air. The coated rod, along with an uncoated control specimen, was annealed in ambient air at 550° C. for 115 hours. The uncoated sample showed a dark oxide film, while the coated sample retained the metallic luster of the original rod (FIG. 4).

Example 6

Metal and alloy surfaces have varying surface finishes and roughness depending on the desired application, cost of preparation and other factors. Many metal and alloy surfaces are grit-blasted before coating to clean off prior surface preparations or existing corrosion residues. A coupon of type 304 stainless steel is grit blasted to give a rough surface finish. The solution described in Example 1 is deposited on the surface through dip coating. The coating is dried in flowing air and cured with an IR lamp for 5 minutes. Optical microscopy showed that the coating substantially covers the sample and is essentially crack-free. The coupon of annealed, along with an uncoated coupon at 1100° C. for 4 hours in a furnace. The coated coupon shows significantly less weight gain from oxidation than the uncoated coupon.

Weight change after 1100° C., 4 hour exposure in ambient air (mg/cm$^2$)

| | |
|---|---|
| Coated sample | 6.52 |
| Uncoated sample | 26.34 |

Example 7

The inventive material can be used to planarize or smoothen a variety of substrates. The solution of Example 1 is deposited on an alloy substrate. Atomic force microscopic measurements were performed on coated and uncoated samples to determine the root mean square (rms) roughness. The uncoated alloy has a rms roughness of 21 nm. The rms roughness decreases to 7 nm upon application of the coating.

Example 8

Figure 7:
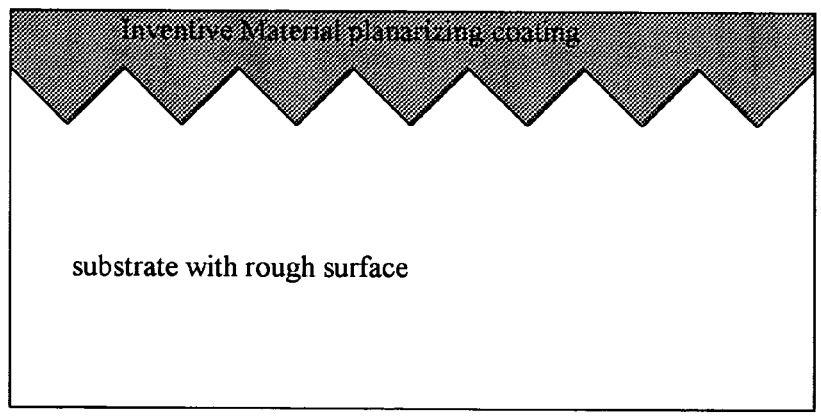
FIG. 7. Schematic showing the planarization effect of a coating of the inventive material on relatively rough surfaces.
Figure 7:
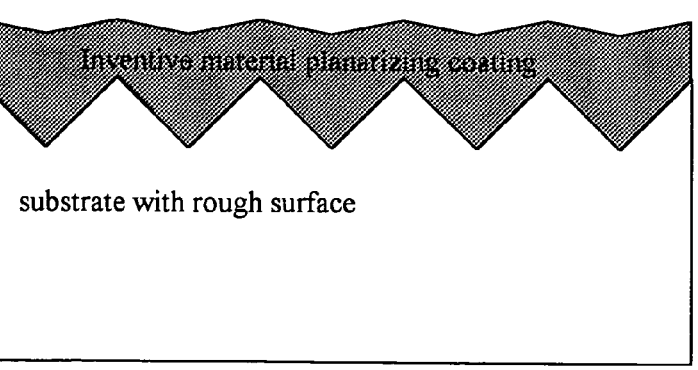
Figure 8:
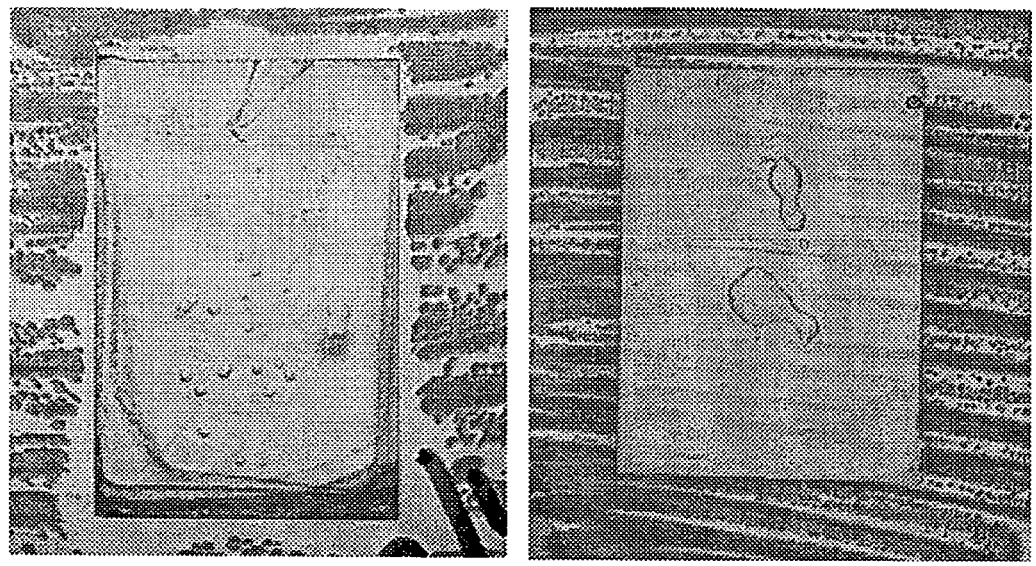
FIG. 8. Comparative photographs showing antimicrobial susceptibility test with e. coli bacterial growth inhibition (A) a slide coated with an inventive material comprising silver ions and (B) 'control' sample, glass slide coated with inventive material and not loaded with antimicrobial silver ions.

Inventive material coatings on metal and silicon substrates can be used for subsequent growth of epitaxial layers for electronic applications. Specifically, this example relates to use of inventive material coating as a template layer for producing high current carrying high temperature superconducting (HTS) tapes. A piece of C-276 nickel-base alloy or Hastelloy foil having an initial "as-received" rms roughness of 570Å is dipped in the solution of Example 1. The coated foil is dried in flowing air and heat treated at 570° C. for 1 minute in a preheated furnace. The rms roughness is reduced to below 140 Å for a nominal thickness of 100 nm for the inventive material coating. FIG. 7 shows a schematic of the planarized surface.

Example 9

Using an ion-beam assisted electron beam deposition process, a thin oxide of yttria stabilized zirconia (YSZ) (thickness ranging from 50-100 nm) with substantial biaxial texture is grown on the surface of the inventive material coating of Example 7. A thin cerium oxide layer (10-20 nm) with substantial biaxial texture is grown on top of YSZ to provide a lattice-matching template for subsequent growth of 1-2 μm high temperature superconducting YBCO film by electron beam deposition. The entire multilayer stack represents a HTS coated conductor architecture which can be produced in long lengths.

Example 10

Inventive material coated substrate of Example 7 is used to deposit a 100 Å layer of MgO using ion-beam assisted e-beam deposition process which has substantial biaxial texture. Subsequent layers of cerium oxide and YBCO films are deposited as described in Example 8. Note that the inventive material coating is serving both as a adhesion/planarization layer as well as an effective diffusion barrier. Thus, a separate diffusion barrier layer of YSZ or other oxide may not be necessary to avoid diffusion of species from substrate into YBCO that will degrade superconducting properties. With this architecture, the YBCO layer will have substantially improved texture and uniformly textured over large areas and will carry high critical current densities as desired in related HTS applications.

In another embodiment of this example, a multilayer coating of inventive material can be deposited with varying aluminum to phosphorous ratios such that the adhesion is further improved and the planarization is further improved. These improvements will result in a more mechanically robust HTS coated conductor with consistent properties over long lengths.

In yet another embodiment of this example, the same procedure described herein can be followed to develop a stack using silicon as a substrate. Inventive material coated silicon substrates can be used as templates for growth of IBAD YSZ or MgO layers with substantial biaxial texture. These epitaxial layers can then serve as templates for further growth of HTS, ferroelectric, piezoelectric, or other functional layers comprising of oxides with cubic symmetry. The inventive material layers can also serve as dielectric layers for silicon-based devices.

In yet another embodiment of this example, the as-received substrate with rms roughness values of about 570 Å is mechanically polished, using a lapping technique, to reduce the roughness value to below about 400 Å, more preferably below about 300 Å and most preferably below about 200 Å and then the inventive material coating (about 100 nm thick) is deposited (either as a single layer or multiple layers) to further reduce the roughness below about 70 Å, preferably below 40 Å and more preferably below about 20 Å and most preferably below about 10 Å. The highly smooth amorphous surfaces can then serve as templates for IBAD growth of oxides using a physical vapor deposition technique.

Example 11

In addition to resistance to oxidation and corrosion at elevated temperatures, inventive material coatings can protect against atmospheric corrosion at lower temperatures. Lab tests for salt corrosion resistance are carried out in a salt fog chamber, according to ASTM standard B117. A coupon of aluminum alloy 6061 was dipped in the composition of Example 1 and retracted. The coupon was dried in flowing air and heat treated at 500° C. for 2 minutes. This coupon, along with an uncoated coupon was placed in a salt fog chamber for 170 hours. The coated coupon showed significantly less corrosion than the coated coupon (FIG. 7).

Example 12

Titania nanoparticles are know to exhibit desired optical or mechanical properties as a bulk material or when incorporated into a film. A transparent host matrix for the titania nanoparticles is required if transmission of light to the titania particles is desired. Titania nanoparticles can be produced in an inventive material precursor solution by the addition of titanium isopropoxide solution. 4 mL of titanium isopropoxide is added to 9.8 mL water and 0.2 mL nitric acid to produce a solution with a cloudy appearance (partially hydrolyzed). This solution is added to the solution of Example 1 to produce a titania containing precursor of the inventive material.

Example 13

A coating of an inventive material containing titania nanoparticles can be deposited on a substrate, including but not limited to steel or glass or fused silica. A piece of 304 stainless steel is dipped in the solution of Example 11 and removed. The coating is dried with cool air and heat treated to 800° C. for ½ hour. The resulting coating is hermetic and optically transparent.

Example 14

Zirconia inclusion in a film are desired to induce certain desirable optical or mechanical properties. A nanocomposite of the inventive material and zirconia can also be made. 1.49 g $ZrO(NO_3)_3 \cdot xH_2O$ was dissolved in 10 mL of ethanol. In a separate beaker, 6.46 g $P_2O_5$ was dissolved in 70 mL ethanol. In another beaker 59.9 g $Al(NO_3)_3 \cdot 9H_2O$ was dissolved in 140 mL ethanol. All three solutions were mixed together and stirred. A clear solution resulted. The solution was dried at 150° C. in a convection oven to form a gel powder and annealed to 1000° C. for 1 hour. Crystals of tetragonal $ZrO_2$ and predominately inventive material were identified by x-ray diffraction.

Example 15

A coating of the inventive material with zirconia nanoparticles is deposited on 304 stainless steel by dipping in the solution of Example 13. The coupon is dried in flowing air and heat treated to 800° C. for 20 min to produce a nanocomposite coating.

Example 16

With reference to the precursor of Example 1, the ethanolic $P_2O_5$ solution is added to the ethanolic nitrate solution. 0.1 g of $AgNO_3$ solid is dissolved in 10 mL of the mixed solution.

Example 17

A coated glass specimen prepared with a treated aluminophosphate compound of Example 16 is placed onto a Petri dish containing *E.coli* bacterial strain. A control petri dish without the slide is also prepared. Both slides are kept at 35° C. for 2 days. After two days, silver/inventive material coated glass showed no bacterial growth around the slide as compared to the control experiment showing the growth along the strain streaks Example 18

A 1'×2" stainless steel foil was dipped into the composition of example 1. The coupon was cured at 500° C. for 5 minutes in a preheated furnace. The resulting coating was highly reflective.

Figure 9:
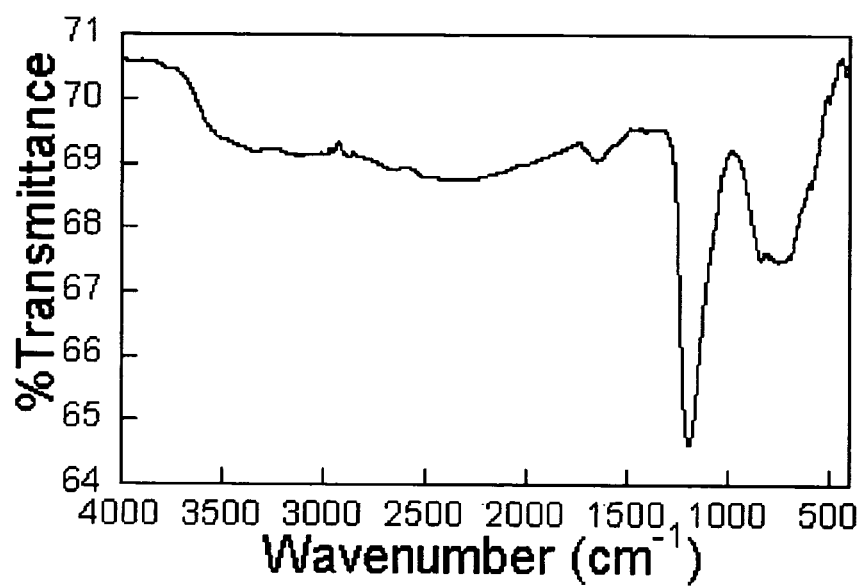
FIG. 9. Grazing angle Fourier Transform Infrared reflectance spectrum of an embodiment of the inventive material coated on a stainless steel sample and cured at 500° C. for 5 minutes.

FIG. 9 shows the 80 Grazing angle FTIR spectrum of the cured stainless steel foil recorded using Perkin-Elmer Spectrum One FTIR spectrometer. Strong absorption peak centered near 1207 $cm^{-1}$ along with a broad peak centered near 735 $cm^{-1}$ were observed. These peaks are due to phosphate and Al—O—P group vibrations. The peak near 830 $cm^{-1}$ is also observed which may be due to Al—O—Al bonding groups. Those skilled in the art will understand that these peak positions can vary in the range 1280 $cm^{-1}$-1180 $cm^{-1}$ and 860 $cm^{-1}$-700 $cm^{-1}$ depending on the curing temperatures, composition of the precursor solution, coated substrate and other conditions. Peak intensities also can vary based on the coating, curing and other conditions.

We claim:

1. A method of using an aluminophosphate compound to decrease surface roughness, said method comprising:
   providing a precursor to an aluminophosphate compound, said precursor comprising aluminum ions and phosphate esters in a fluid medium;
   applying said precursor medium to a substrate selected from a bearing and a gear, said substrate having a first surface roughness value; and
   treating said applied medium for a time and at a temperature sufficient to provide a substantially amorphous aluminophosphate compound on said substrate, wherein the surface of said substrate is planarized and has a second roughness value decreased compared to said first surface roughness value.

2. The method of claim 1 wherein said medium is applied by a process selected from dip-coating, spraying, flow-coating and spin-coating.

3. The method of claim 1 wherein said treated substrate is exposed to one of an oxidation and corrosion inducing environment during one of processing and service.

4. The method of claim 1 wherein said substrate is selected from a steel, a nickel-based alloy, a superalloy, titanium, a titanium-based alloy, niobium, a niobium-based alloy, molybdenum and a molybdenum-based alloy.

5. The method of claim 1 wherein said surface roughness value is decreased by at least about 3-fold.

6. A method of using an aluminophosphate compound to decrease surface roughness for subsequent component deposition, said method comprising:
   providing a precursor to an aluminophosphate compound, said precursor comprising aluminum ions and phosphate esters in a fluid medium;
   applying said precursor medium to a substrate, said substrate having a first surface roughness value;
   treating said applied medium for a time and at a temperature sufficient to provide a substantially amorphous aluminophosphate compound on said substrate, wherein the surface of said substrate is planarized and has a second roughness value decreased compared to said first surface roughness value;
   depositing a biaxially-textured component selected from magnesium oxide, yttria and yttria stabilized zirconia on said aluminophosphate compound; and
   depositing an electromagnetic component on said textured component.

7. The method of claim 6 wherein said medium is applied by a process selected from dip-coating, spraying, flow-coating and spin-coating.

8. The method of claim 6 wherein said electromagnetic component is a superconducting YBCO layer.

9. The method of claim 6 wherein said surface roughness value is decreased by at least about 3-fold.

* * * * *

UNITED STATES PATENT AND TRADEMARK OFFICE
CERTIFICATE OF CORRECTION

| | |
|---|---|
| PATENT NO. | : 7,311,944 B2 |
| APPLICATION NO. | : 10/745955 |
| DATED | : December 25, 2007 |
| INVENTOR(S) | : Sankar Sambasivan, Kimberly A. Steiner and Krishnaswamy K. Rangan |

Page 1 of 1

It is certified that error appears in the above-identified patent and that said Letters Patent is hereby corrected as shown below:

Col. 6, Line 1: "quartemary" should be --quarternary--

Col. 9, Line 47: "an" should be --and--

Signed and Sealed this

Twelfth Day of August, 2008

JON W. DUDAS
*Director of the United States Patent and Trademark Office*